US006353176B1

(12) United States Patent
Taylor et al.

(10) Patent No.: US 6,353,176 B1
(45) Date of Patent: Mar. 5, 2002

(54) MANUFACTURING METHOD FOR SOLAR CELL ARRANGEMENTS

(75) Inventors: Stephen John Taylor, Ingatestone; Christopher Hardingham, Danbury; Trevor Arthur Cross, Chelmsford, all of (GB)

(73) Assignee: EEV Limited, Essex (GB)

( * ) Notice: Subject to any disclaimer, the term of this patent is extended or adjusted under 35 U.S.C. 154(b) by 0 days.

(21) Appl. No.: 09/387,759

(22) Filed: Sep. 1, 1999

(30) Foreign Application Priority Data

Sep. 4, 1998 (GB) ................................................ 9819283

(51) Int. Cl.$^7$ ............................................. H01L 25/00
(52) U.S. Cl. ...................... 136/256; 136/255
(58) Field of Search ................... 136/256, 255

(56) References Cited

U.S. PATENT DOCUMENTS

| 3,912,539 A | 10/1975 | Magee ........................ 136/244 |
| 4,481,378 A | 11/1984 | Lesk ........................... 136/244 |
| 4,638,109 A | 1/1987 | Ishihara et al. .............. 136/244 |
| 4,759,803 A | * 7/1988 | Cohen ......................... 136/244 |

FOREIGN PATENT DOCUMENTS

| EP | 0369666 | 5/1990 |
| EP | 0535614 | 4/1996 |
| GB | 2216337 | 10/1988 |
| GB | 2206732 | 1/1989 |
| GB | 2208036 | 2/1989 |
| WO | WO 89/05521 | 6/1989 |

OTHER PUBLICATIONS

Patent Abstract/Japan; vol. 9, No. 81 (E307) & JP 59021427–A.

* cited by examiner

*Primary Examiner*—Mark Chapman
(74) *Attorney, Agent, or Firm*—Donald C. Casey, Esq.

(57) ABSTRACT

In a manufacturing method of a solar cell arrangement, a p-n junction is formed in semiconductor material which is then separated to give a main body and an off-cut. The off-cut is connected in reverse parallel across the main body so as to act as a protection diode for a solar cell which comprises that main body. The off-cut protection diode may be placed adjacent the main body or may alternatively be mounted on the front or rear of the solar cell.

17 Claims, 2 Drawing Sheets

MANUFACTURING METHOD FOR SOLAR CELL ARRANGEMENTS

FIELD OF THE INVENTION

This invention relates to a manufacturing method for solar cell arrangements and more particularly to solar cells having protection against reverse current through them.

BACKGROUND TO THE INVENTION

In one type of solar cell (or photovoltaic cell), a voltage is developed across a p-n junction in a semiconductor when it is irradiated by photons. A plurality of solar cells may be connected together in an array to provide a power supply, such arrangements commonly being used in spacecraft and satellites for example. During operation, there may be circumstances where a single solar cell is shadowed or is faulty, and therefore not producing power, whilst the remainder of a sting of cells with which is connected in series is illuminated and producing power. This may lead to current being driven in reverse through the shadowed solar cell. Power is dissipated within the cell which is proportional to the reverse voltage across it. If the power density is sufficiently high, the cell may irreversibly break down.

One way in which this problem may be alleviated is to use a protection diode wired across one or several solar cells in reverse parallel with them. If one of the cells across which it is connected is driven into reverse bias, the protection diode diverts current from the cell. This limits the power dissipation in the shadowed cell by both limiting the voltage across the shadowed cell and by passing the reverse current.

The present invention seeks to provide an improved method of manufacturing solar cell arrangements which is particularly advantageous when applied to GaAs solar cells and cascade solar cells, although other types of solar cell may also benefit from it.

SUMMARY OF THE INVENTION

According to the invention, a method of manufacturing a solar cell arrangement includes the steps of:

forming a p-n junction in semiconductor material; separating the semiconductor material along a plane across the p-n junction to give an off-cut and a main body;

electrically connecting the off-cut in reverse parallel across a main body such that the off-cut forms a protection diode for a solar cell comprising that main body; and providing first and second electrically conductive contacts on the front and rear respectively of the semiconductor material.

A method in accordance with the invention enables a protection diode to be readily manufactured at the same time that the solar cell itself is fabricated without requiring a large number of additional steps. In addition, because the diode is an off-cut of the main body which forms the solar cell, if the diode is placed adjacent the main body, being either spaced therefrom or mounted on the side of the main body, it closely conforms to the shape of the main body at that location, giving a particularly compact arrangement. This is particularly advantageous where the arrangement is to be incorporated with others in an array.

In another embodiment, the diode is mounted on the front or rear of the solar cell. This may require that a coverglass subsequently bonded to the solar cell include a recess for accommodation of the diode. However, a diode produced by a method in accordance with the invention may have only a relatively small thickness and it may be possible to use a standard coverglass and conventional automatic glassing techniques.

The off-cut may be electrically connected to the main body from which it was separated or alternatively to another main body formed when a different off-cut was separated from it. For example, a plurality of solar cells and protection diodes may be produced by separating semiconductor material to provide a plurality of off-cuts and a plurality of main bodies. It is not necessary that each off-cut be specifically matched to the main body from which it was separated.

Advantageously, at least one of the first and second electrically conductive contacts is provided before the semiconductor material is separated. The contact or contacts may be formed so that in addition to being extensive over the main body, they also cover the region of the semiconductor material surfaces which will be included in the off-cut following the separation step. The contact or contacts may then be utilized in connecting the off-cut to the main body. Alternatively, the metallization step may be carried following separation but this may be less convenient.

Preferably, the semiconductor material is separated by cutting it. For example, this may be done mechanically using a cutting tool or by a laser. Alternatively, the semiconductor material might be separated by fracturing it after pre-scoring it along the desired line and then applying pressure, perhaps on a ridged support to complete the separation step.

The separation may carried out to give any convenient shape of noff-cut and remaining main body. For example, the off-cut may be triangular in plan view, circular, square, rectangular or an irregular shape.

The method may be used in the manufacture of GaAs solar cells, cascade solar cells or may be applied to other types of solar cell.

BRIEF DESCRIPTION OF DRAWINGS

Some ways in which the invention may be performed are now described by way of example with reference to the accompanying drawings in which.

DESCRIPTION OF PREFERRED EMBODIMENT

Figure 1:
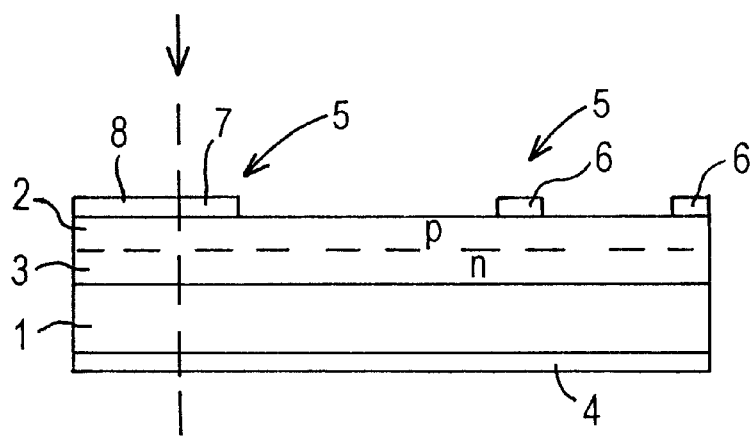
FIGS. 1 to 6 schematically show steps in a method in accordance with the invention.
Figure 2:
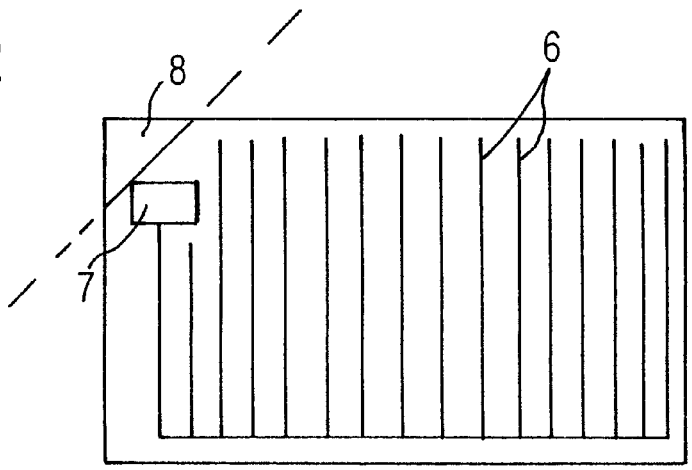

With reference to FIGS. 1 and 2, which show in side and plan view a step in the method, a germanium substrate 1 of rectangular plan view is taken and GaAs p and n layers 2 and 3 grown epitaxially thereon. The next step in the process is to add metallization to the front and rear surfaces of the semiconductor material. The rear metallization layer 4 covers the entire back surface of the substrate 1. The front metallization 5 comprises conductive strips 6 extending over part of the front surface, a supplementary pad 7 and a region 8 of metallization over a corner as shown.

Figure 4:
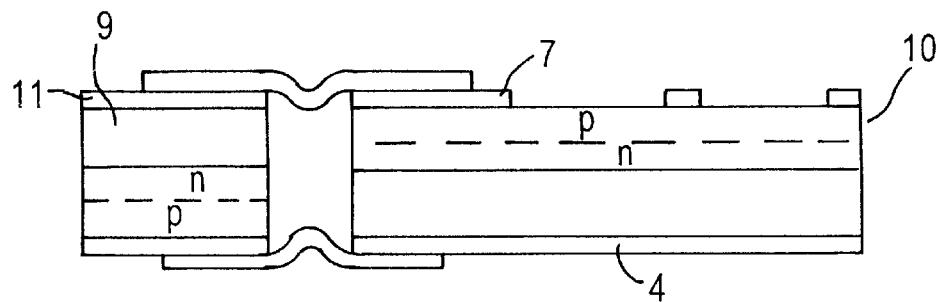

At this stage, the off-cut is then separated from the main body by cutting the device shown in FIGS. 1 and 2 along the plane indicated by the broken lines in those Figures. The resultant off-cut a is then turned over so that as shown in FIG. 4, the n layer is in front of the player. The n contact 11 formed by what was the rear metallization of the device shown in FIG. 1 is connected via a molybdenum contact electroplated with gold to the supplementary pad 7 of the main body 10 and the p contact is connected to the rear metallization 4 of the main body 10. The off-cut 9 is then connected as a protection diode for the solar cell which includes the man body 10.

Figure 5:
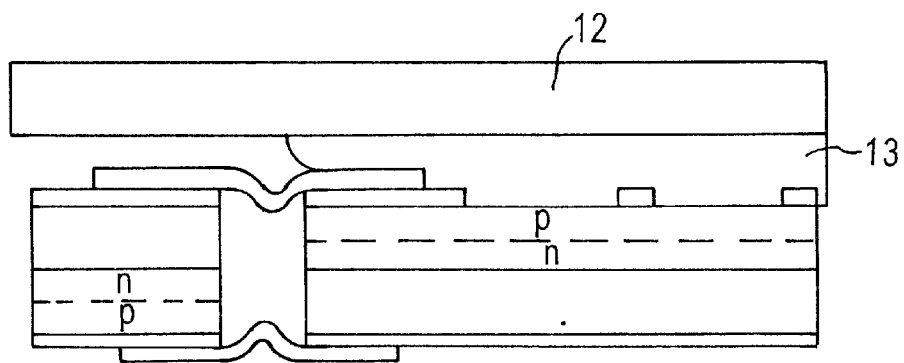

Finally, as shown in FIG. 5, a coverglass 12 is bonded by adhesive 13 to the front surface of the solar cell 10 and in this case is also extensive over the diode 11.

Figure 6:
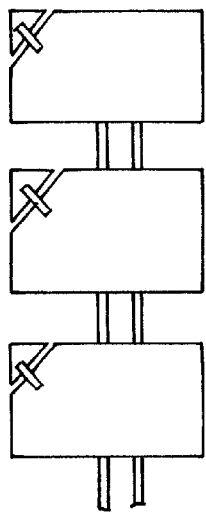

FIG. 6 shows several solar cell arrangements formed in accordance with the method shown in FIGS. 1 to 5 connected as an array in a series string in which the front of the each solar cell is connected to the rear of the adjacent solar cell.

In other methods in accordance with the invention, the diode is mounted on the front or the rear surfaces of the main body. Although conveniently, it is connected to the main body on which it is mounted, it may alternatively be connected to an adjacent solar cell.

Figure 3:
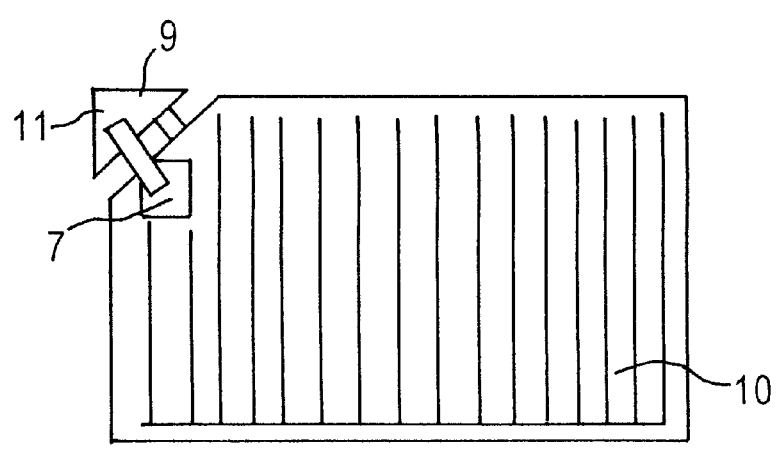

In the arrangement shown in FIGS. 3 and 4, the diode is spaced from the main body by a gap of about 1 mm but alternatively, it could be rigidly bonded to the main body, for example by a bead of epoxy to join the back contacts.

We claim:

1. A method of manufacturing a solar cell arrangement including steps of:
    forming a p-n junction in semiconductor material;
    separating said semiconductor material along a plane across said p-n junction to give an off-cut and a main body with the off-cut spaced away from the main body;
    electrically connecting said off-cut in reverse parallel across a main body such that said off-cut forms a protection diode for a solar cell comprising that main body; and
    providing first and second electrically conductive contacts on the front and rear surfaces respectively of the semiconductor material.

2. A method as claimed in claim 1 wherein said off-cut is electrically connected to the main body from which it was separated.

3. A method as claimed in claim 1 wherein said off-cut is electrically connected to a main body formed when a different off-cut was separated from it.

4. A method as claimed in claim 1 wherein at least one of said first and second electrically conductive contacts is provided before the semiconductor material is separated.

5. A method as claimed in claim 1 wherein said semiconductor material is separated by cutting it.

6. A method as claimed in claim 1 wherein the semiconductor material is substantially rectangular in plan view prior to being separated and the off-cut is triangular in plan view.

7. A method as claimed in claim 1 and including the step of mounting said off-cut on one of the front and back of said solar cell.

8. A method as claimed in claim 1 wherein said diode is mounted on the side of the solar cell.

9. A method as claimed in claim 1 wherein the semiconductor material is GaAs.

10. A method as claimed in claim 1 wherein the solar cell is a cascade solar cell.

11. A method as claimed in claim 1 and including the step of mounting a coverglass on said solar cell.

12. A method as claimed in claim 11 wherein the coverglass covers said diode.

13. A method as claimed in claim 1 wherein said semiconductor material is separated by cutting it and including mounting a coverglass on sad solar cell which coverglass covers said diode.

14. A method as claimed in claim 13 wherein the semiconductor material is substantially rectangular in plan view prior to being separated and the off-cut is triangular in plan view.

15. A method as claimed in claim 14 wherein said diode is mounted on the side of the solar cell.

16. A method as claimed in claim 1 used to manufacture a plurality of solar cell arrangements, and including the step of connecting said arrangements an array.

17. A solar cell arrangement manufactured in accordance with a method which includes the steps of:
    forming a p-n junction in semiconductor material;
    separating said semiconductor material along a plane across said p-n junction to give an off-cut and a main body with the off-cut spaced away from the main body;
    electrically connecting said off-cut in reverse parallel across a main body such that said off-cut forms a protection diode for a solar cell comprising that main body; and
    providing first and second electrically conductive contact on the front and rear surfaces respectively of the semiconductor material.

\* \* \* \* \*